United States Patent
Cushman et al.

[11] Patent Number: 6,150,703
[45] Date of Patent: Nov. 21, 2000

[54] LATERAL MODE SUPPRESSION IN SEMICONDUCTOR BULK ACOUSTIC RESONATOR (SBAR) DEVICES USING TAPERED ELECTRODES, AND ELECTRODES EDGE DAMPING MATERIALS

[75] Inventors: Drew Cushman, Lomita; Jay D. Crawford, Long Beach, both of Calif.

[73] Assignee: TRW Inc., Redondo Beach, Calif.

[21] Appl. No.: 09/106,729

[22] Filed: Jun. 29, 1998

[51] Int. Cl.⁷ ................................................. H01L 29/82
[52] U.S. Cl. .......................... 257/415; 257/416; 310/311; 310/321; 333/187; 333/189; 333/191; 333/194; 438/50
[58] Field of Search ..................................... 257/415, 416; 333/189, 190, 191, 192, 187, 188, 194; 310/321, 311; 438/50

[56] References Cited

U.S. PATENT DOCUMENTS

| | | | |
|---|---|---|---|
| 3,209,178 | 9/1965 | Koneval | 310/9.1 |
| 4,013,982 | 3/1977 | Wood et al. | 333/72 |
| 4,149,102 | 4/1979 | Kellen | 310/320 |
| 4,342,014 | 7/1982 | Arvanitis | 333/191 |
| 4,839,618 | 6/1989 | Roberts et al. | 333/191 |
| 5,382,930 | 1/1995 | Stokes et al. | 333/191 |
| 5,670,919 | 9/1997 | Gamo | 333/189 |
| 5,850,166 | 12/1998 | Katoh et al. | 333/189 |
| 5,939,956 | 8/1999 | Arimura et al. | 333/189 |

FOREIGN PATENT DOCUMENTS

| | | |
|---|---|---|
| 6164293 | 6/1994 | Japan . |
| 406232687 | 8/1994 | Japan . |

OTHER PUBLICATIONS

"SBAR Filter Monolithically Integrated With an HBT Amplifier", Cushman et al., *IEEE Ultrasonic Symposium*, 1990, pp. 519–524.

"SBAR–HEMT Monolithic Receiver Front End With Bulk Acoustic Filters", Cushman, et al., *GOMAC Digest*, 1997, pp. 279–282.

"Monolithic Bulk Acoustic Filters to X–Bank In GaAs", Stokes, et al. *IEEE Ultrasonic Symposium*, 1993, pp. 547–551.

*Primary Examiner*—William Mintel
*Attorney, Agent, or Firm*—Michael S. Yatsko

[57] ABSTRACT

A semiconductor bulk acoustic resonator (SBAR) with improved passband insertion loss and phase performance characteristics is suitable for use in a wide variety of narrowband filtering applications. The SBAR is configured to suppress lateral propagating acoustical wave modes. The lateral acoustical wave modes are controlled by varying the lateral dimension of the resonator electrodes and or utilizing a viscous acoustic damping material, such as a viscoelastic material, such as polyimide, applied along at least a portion of the perimeter of the electrodes to attenuate reflections of the lateral acoustic modes at the electrode edges back into the electrode region.

7 Claims, 4 Drawing Sheets

SQUARE AND TAPERED
ELECTRODE GEOMETRIES

FREQUENCIES: $F_1 > F_2 > F_3$

SQUARE AND TAPERED
ELECTRODE GEOMETRIES

FREQUENCIES: $F_1 > F_2 > F_3$

LATERAL MODE SUPPRESSION IN SEMICONDUCTOR BULK ACOUSTIC RESONATOR (SBAR) DEVICES USING TAPERED ELECTRODES, AND ELECTRODES EDGE DAMPING MATERIALS

BACKGROUND OF THE INVENTION

1. Field of the Invention

The present invention relates to a Semiconductor Bulk Acoustic Resonator (SBAR) or Bulk Acoustic Wave (BAW) resonator configured to reduce lateral acoustic modes in order to improve the insertion loss and phase characteristics of SBAR filters.

2. Description of the Prior Art

Semiconductor bulk acoustic resonators (SBARs) are known in the art. An example of such an SBAR is disclosed in commonly owned U.S. Pat. No. 5,382,930; incorporated by reference. SBAR devices include resonators, stacked crystal filters (SCFs), multipole filters based on inductor coupled topologies disclosed in the '930 patent and other filter topologies. Because of their relatively small size, high Q, and high operating frequency, such SBARs are particularly well suited in high performance applications where space is limited.

Such SBARs are thin film acoustic resonators fabricated on a semiconductor substrate, such as gallium arsenide (GaAs), making them particularly suitable for integration with high electron mobility transistor (HEMT) and heterojunction bipolar transistor (HBT) microwave monolithic integrated circuits (MMICs), for example, as disclosed in: "SBAR Filter Monolithically Integrated With an HBT Amplifier", Cushman et al., *IEEE Ultrasonic Symposium*, 1990, pp. 519–524; and "SBAR-HEMT Monolithic Receiver Front End With Bulk Acoustic Filters", Cushman et al., *GOMAC Digest*, 1997, pp. 279–282; hereby incorporated by reference. Such SBARs typically include a thin layer or film of a piezoelectric material, such as aluminum nitride or zinc oxide which may be deposited on the semiconductor substrate, for example, by sputtering. Thin film metal electrodes are formed on opposite surfaces of the piezoelectric layer to form an SBAR resonator. A stacked crystal filter (SCF) is similar but includes two AIN layers and three metal electrodes.

Irregularities of insertion loss and phase have heretofore prevented such SBARs from being used in many applications. Such performance irregularities are due to the undesired lateral acoustic modes of such SBARs. These lateral acoustic modes are known to interfere with the desired longitudinal acoustic mode thereby causing the performance irregularities discussed above.

SUMMARY OF THE INVENTION

It is an object of the present invention to solve various problems in the prior art.

It is yet another object of the present invention to provide an (SBAR) filter with improved performance characteristics.

It is yet a further object of the present invention, to provide an SBAR that is configured to suppress lateral acoustic modes.

Briefly, the present invention relates to a semiconductor bulk acoustic resonator (SBAR) with improved passband insertion loss and phase performance. The SBAR is configured to suppress lateral propagating acoustical wave modes. The lateral acoustical wave modes are controlled by varying the lateral dimension of the resonator electrodes and. or utilizing a visco-elastic acoustic damping material, such as polyimide, along at least a portion of the perimeter of the electrodes to attenuate reflections of the lateral acoustic modes at the electrode edges back into the electrode region.

BRIEF DESCRIPTION OF THE DRAWING

These and other objects of the present invention will be readily understood with reference to the following specification and attached drawing, wherein.

DETAILED DESCRIPTION OF THE INVENTION

The present invention relates to a semiconductor bulk acoustic resonator (SBAR) with improved performance characteristics. As will be discussed in more detail below, the SBAR is configured to suppress lateral acoustic modes which improves the smoothness of the insertion loss and phase response characteristics.

Figure 1:
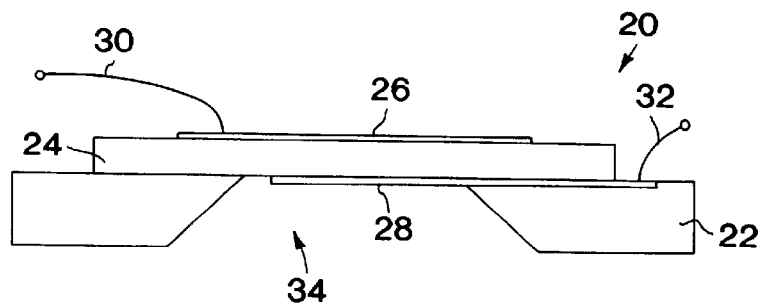
FIG. 1 is a cross sectional view of a known semiconductor bulk acoustic resonator.
Figure 2:
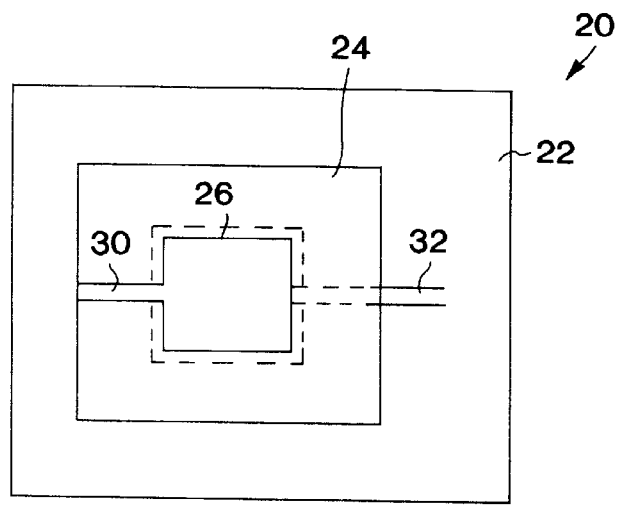
FIG. 2 is an elevational view of the known SBAR illustrated in FIG. 1.

In order to provide a complete understanding of the invention, a known SBAR is illustrated in FIGS. 1 and 2 and discussed below. The SBAR, generally identified with the reference numeral 20, includes a semiconductor substrate 22, such as gallium arsenide GaAs. A piezoelectric layer 24 is formed above the semiconductor substrate 22, which may be formed from various different piezoelectric materials, such as aluminum nitride, zinc oxide or the like. As generally known, the piezoelectric layer 24 may be formed by sputtering or by various other processes. The piezoelectric layer 24 is adapted to be sandwiched between a pair of electrodes 26 and 28, formed on opposing surfaces of the piezoelectric layer 24. The electrodes 26 and 28 may be fabricated by various methods including metal vapor deposition. Input and output traces 30 and 32, respectively, may be formed in the same manner as the electrodes 26 and 28 and electrically coupled to the electrodes 26 and 28, respectively to provide input and output terminals for the device.

A via 34 is formed on one side of the semiconductor substrate 22 as generally shown in FIG. 1. The via 34 may be formed by various processes including etching. The resonating region of the SBAR is formed by the overlap region of the electrodes 26 and 28.

Known SBARs, for example as illustrated in FIGS. 1 and 2, are known to include generally square or rectangular electrodes 26 and 28. When such metal electrodes 26 and 28 are applied to the piezoelectric layer 24, the velocity of the acoustic waves within the piezoelectric material 24 is reduced. This change in velocity between the metallized electrodes 26 and 28 and the free piezoelectric regions around the resonator are known to cause a reflection of lateral propagating acoustic waves at the electrode edges. These reflections confine the lateral mode and produce standing wave resonance.

Figure 3A:
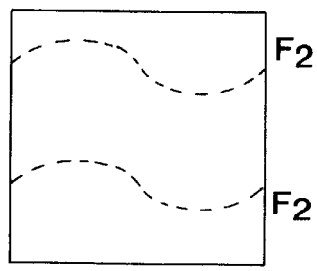
FIG. 3A illustrates a square electrode geometry for a known SBAR.
Figure 5:
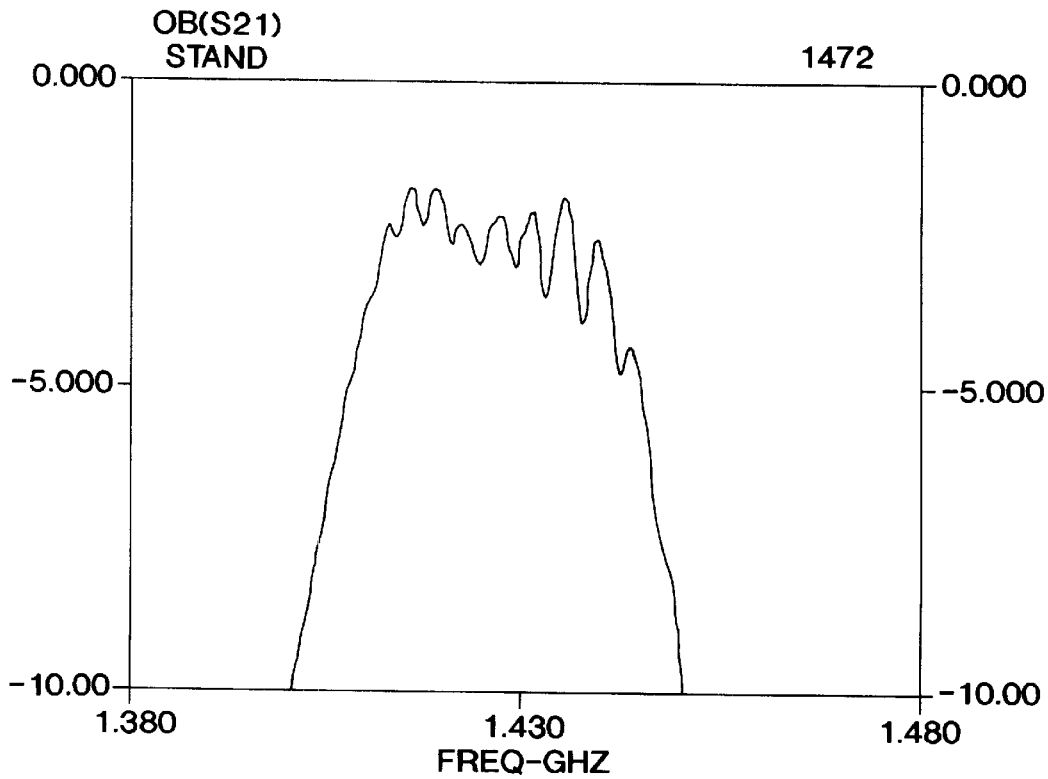
FIG. 5 illustrates the frequency response of a 1.43 GHz SBAR filter with rectangular electrodes which illustrates a ragged pass band caused by interference of the undesired lateral mode with the longitudinal modes.
Figure 7:
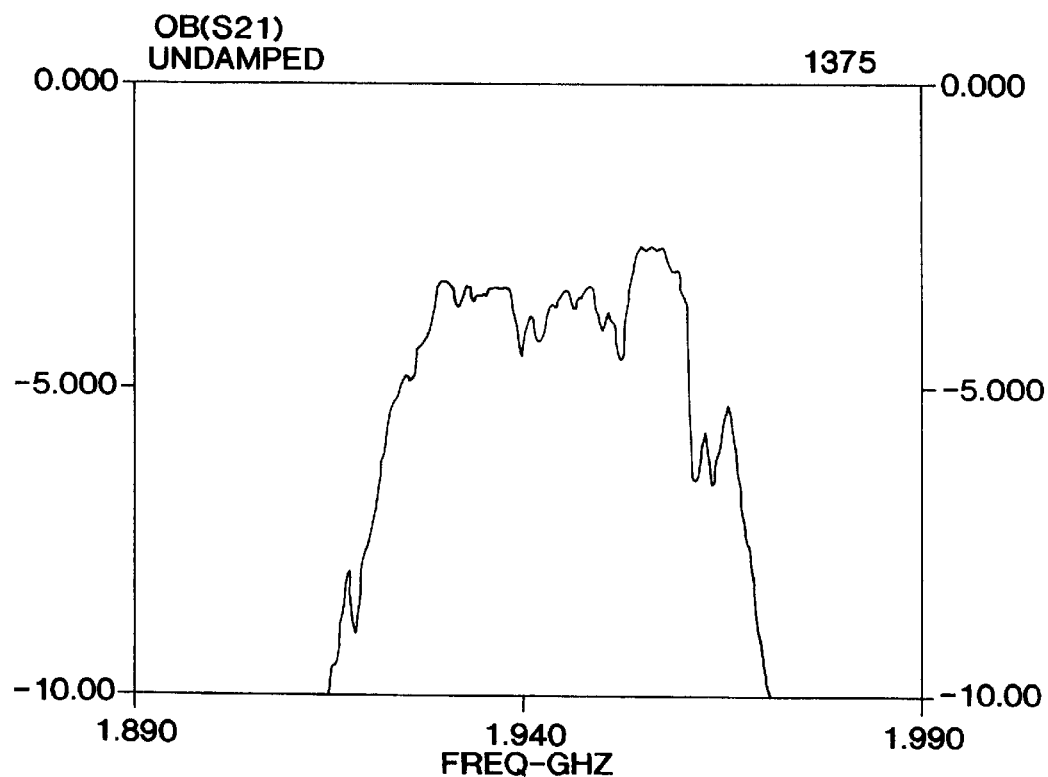
FIG. 7 is a graphical illustration showing the frequency response of SBAR of a 1.94 GHz SBAR utilizing a rectangular electrode geometry.

The frequency of the resonance of the lateral mode is determined by the lateral dimensions of the metal electrodes and by the acoustic velocity of the various lateral resonate modes. With reference to FIG. 3A, with a generally square or rectangular electrode geometry, all of the energy of the resonant mode is at a single frequency, illustrated in FIG. 3A as the frequency F2. Interference between this lateral mode and the desired longitudinal mode results in pass band variations as illustrated in FIG. 5 for a 1.43 GHz SBAR and FIG. 7 for a 1.94 GHz SBAR.

Figure 3B:
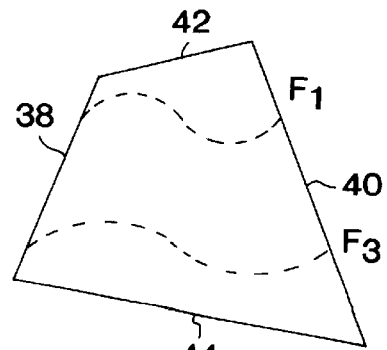
FIG. 3B illustrates a tapered electrode geometry for an SBAR in accordance with the present invention.
Figure 6:
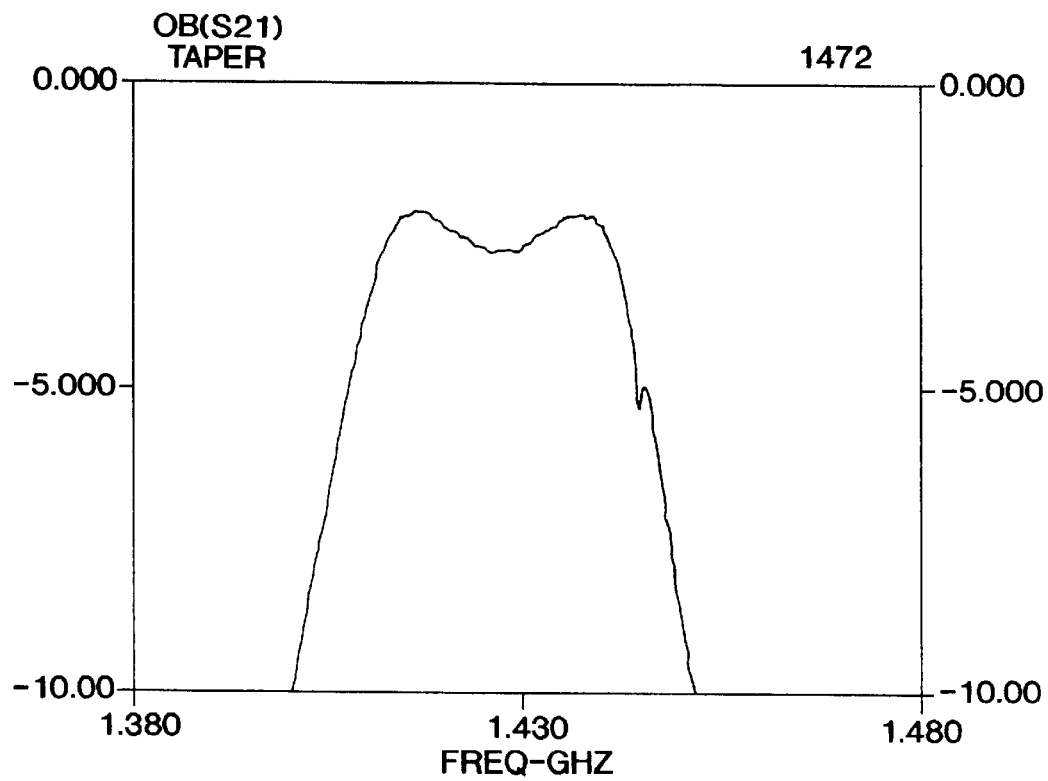
FIG. 6 illustrates the improved response of the SBAR tested in FIG. 5 utilizing a tapered electrode geometry in accordance with the present invention.
Figure 8:
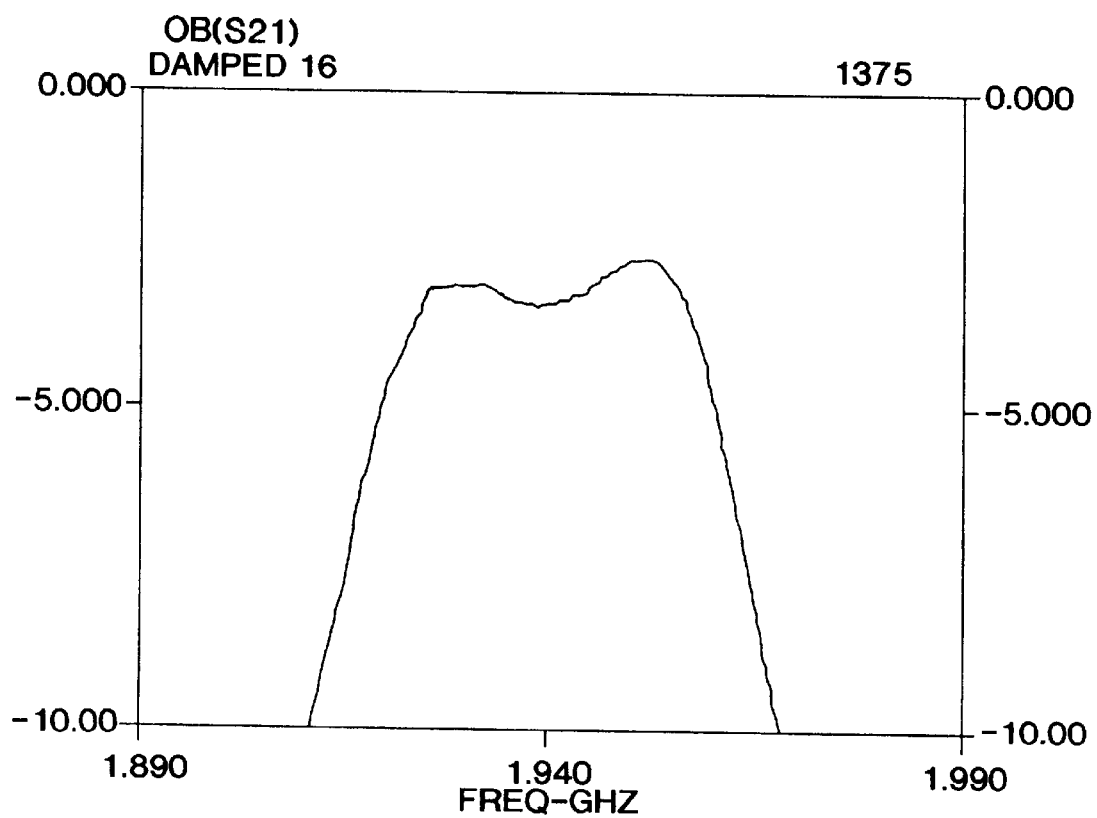
FIG. 8 illustrates the improved response of the SBAR tested in FIG. 7 which utilizes acoustic damping at the edges of the electrode in accordance with the present invention.

In accordance with the present invention, SBARs are provided with suppressed lateral acoustical wave modes which, provide dramatically improved pass band performance as illustrated in FIGS. 6 and 8. The ripple in the pass band is suppressed. Two methods in accordance with the present invention may be used either singly, as illustrated in FIG. 3B and 4A, or in combination, as illustrated in FIG. 4B, to suppress the lateral acoustic modes.

In the first method in accordance with the present: invention, the electrodes are tapered with one or more tapered sides 38–42. In this embodiment, one or both of the opposing side pairs 38, 40 and 42, 44 may be formed to be non-parallel. More particularly, the lateral dimension of the electrodes is varied so that the frequency of the lateral resonant mode is spread over a range of frequencies with reduced intensities, for example, $F_1$ and $F_3$, where $F_1 > F_2 > F_3$, as illustrated in FIG. 3B. As such, the frequency of the individual lateral modes is spread over a wider range of frequencies, which reduces the level of pass band interference and insertion loss variation. More particularly, an electrode geometry with parallel sides is known to produce a series of strong resonant peaks that can cause severe interference with the desired longitudinal resonance. An electrode with tapered non parallel edges, for example, as illustrated in FIG. 3B, spreads each resonance over a range of frequencies, thus reducing the energy at any particular frequency. Other geometries are also suitable to reduce the coincidence of lateral dimensions or coincident resonant. frequency caused by lateral acoustic modes.

Figure 4A:
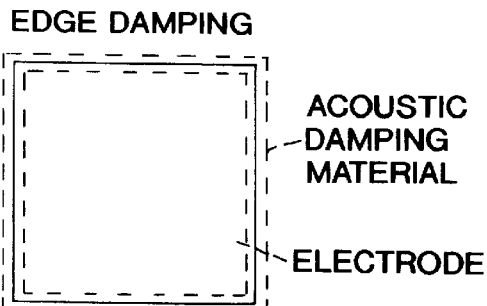
FIG. 4A illustrates the use of visco-elastic edge damping of an electrode for a SBAR for square electrode geometry in accordance with the present invention.
Figure 4B:
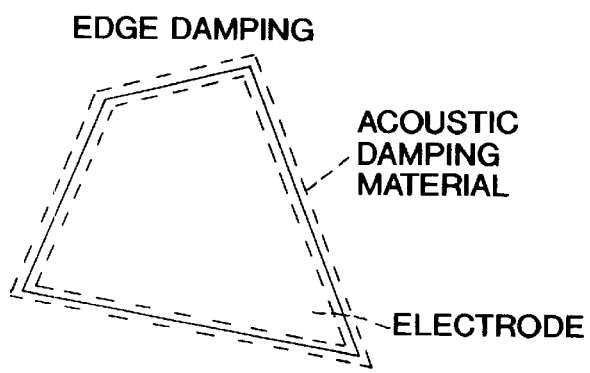
FIG. 4B illustrates the use of visco-elastic edge damping of a tapered electrode geometry in accordance with the present invention.

In a second embodiment of the invention, which may be used either alone, as illustrated in FIG. 4A, or in combination with a tapered electrode geometry as illustrated in FIG. 4B, a viscoelastic acoustic damping material is disposed along at least a portion of the perimeter of the electrodes as illustrated in FIG.4B. The viscous damping material absorbs and attenuates a significant amount of lateral acoustic energy with little absorption of the desired longitudinal acoustic mode.

Various types of acoustic damping materials are suitable, such as any viscoelastic materials, such as polyimide. Essentially, the acoustic damping material can be any material that effectively absorbs acoustic energy that can be applied to an edge of an SBAR electrode.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A semi-conductor bulk acoustic resonator (SBAR) comprising:

a substrate:

a layer of piezo-electric material formed on said substrate; and a pair of electrodes, configured such that said piezoelectric layer sandwiched between said electrodes, said pair of electrodes forming an input electrode and an output electrode; and an acoustic damping material disposed around at least a portion of the perimeter of one of said input or output electodes for suppressing lateral mode resonances of said SBAR.

2. The SBAR as recited in claim 1, wherein said acoustic damping material is disposed around a portion of the perimeter of said electrodes.

3. The SBAR as recited in claim 1, wherein said acoustic damping material is a viscoelastic material.

4. The SBAR as recited in claim 3, wherein said viscoelastic material is a polyimide.

5. A semi-conductor bulk acoustic resonator (SBAR) comprising:

a layer of piezoelectric material;

a pair of electrodes configured such that said piezoelectric material is sandwiched between said electrodes, said electrodes defining input and output electrodes, at least one of said input or output electrodes configured with two pairs of opposing sides, at least one pair of opposing sides formed to be linear and non-parallel to suppress lateral acoustic wave modes.

6. The SBAR as recited in claim 5, wherein said substrate is GaAs.

7. The SBAR as recited in claim 5, wherein said piezoelectric material is selected from the group of aluminum nitride, zinc oxide, or any other piezoelectric material.

* * * * *